(12) United States Patent
Miyanari

(10) Patent No.: US 8,720,456 B2
(45) Date of Patent: May 13, 2014

(54) PROCESSING APPARATUS FLUID-PROCESSING A PROCESS TARGET BODY

(75) Inventor: Atsushi Miyanari, Kawasaki (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 482 days.

(21) Appl. No.: 12/515,891

(22) PCT Filed: Sep. 6, 2007

(86) PCT No.: PCT/JP2007/000965
§ 371 (c)(1),
(2), (4) Date: May 21, 2009

(87) PCT Pub. No.: WO2008/068880
PCT Pub. Date: Jun. 12, 2008

(65) Prior Publication Data
US 2010/0051068 A1    Mar. 4, 2010

(30) Foreign Application Priority Data
Nov. 30, 2006    (JP) .................................. 2006-324224

(51) Int. Cl.
*B08B 3/12* (2006.01)
*B08B 6/00* (2006.01)

(52) U.S. Cl.
USPC .......................................... 134/186; 134/902

(58) Field of Classification Search
USPC ...................... 134/186, 902; 15/321
See application file for complete search history.

(56) References Cited

U.S. PATENT DOCUMENTS

| | | | | |
|---|---|---|---|---|
| 4,917,123 A * | 4/1990 | McConnell et al. | ......... | 134/95.2 |
| 6,207,231 B1 * | 3/2001 | Tateyama | ...................... | 427/240 |
| 6,230,722 B1 * | 5/2001 | Mitsumori et al. | ....... | 134/122 R |
| 6,247,479 B1 * | 6/2001 | Taniyama et al. | ............ | 134/95.2 |
| 6,269,517 B1 * | 8/2001 | Dornier | .......................... | 15/322 |
| 6,329,301 B1 * | 12/2001 | Zahorik et al. | ................ | 438/745 |
| 6,488,573 B1 * | 12/2002 | Kobayashi et al. | ........... | 451/285 |
| 6,550,990 B2 * | 4/2003 | Sakurai et al. | ................ | 396/604 |
| 6,568,408 B2 | 5/2003 | Mertens et al. | | |
| 6,594,847 B1 * | 7/2003 | Krusell et al. | .................. | 15/102 |

(Continued)

FOREIGN PATENT DOCUMENTS

| | | | |
|---|---|---|---|
| EP | 0905746 A1 | | 3/1999 |
| JP | 41 07 854 | * | 9/1992 |

(Continued)

OTHER PUBLICATIONS

Eruopean Patent Office 1 429 188 Jun. 2004.*

(Continued)

*Primary Examiner* — Jason Ko
(74) *Attorney, Agent, or Firm* — Schwegman, Lundberg & Woessner, P.A.

(57) ABSTRACT

The present invention relates to a processing apparatus for fluid-processing a process target body. The processing apparatus is configured to have: supply means for supplying a fluid; process target body processing means for processing the process target body by causing a fluid supplied from the supply means to come into contact with a process target body while preventing the fluid from being scattered; recovery means for recovering the fluid supplied to the process target body processing means; and support means for supporting the process target body processing means so as to not come into contact with the process target body.

10 Claims, 11 Drawing Sheets

(56) References Cited

U.S. PATENT DOCUMENTS

| | | | |
|---|---|---|---|
| 6,629,540 B2* | 10/2003 | Mitsumori et al. | 134/122 R |
| 6,893,172 B2 | 5/2005 | Nakamura et al. | |
| 6,929,903 B2* | 8/2005 | Itoh et al. | 430/329 |
| 6,988,327 B2* | 1/2006 | Garcia et al. | 34/407 |
| 7,234,477 B2* | 6/2007 | de Larios et al. | 134/95.2 |
| 7,339,650 B2* | 3/2008 | Coon et al. | 355/30 |
| 7,806,989 B2* | 10/2010 | Sekiguchi et al. | 134/30 |
| 2002/0130106 A1 | 9/2002 | Mertens et al. | |
| 2003/0000034 A1 | 1/2003 | Welsh et al. | |
| 2004/0197433 A1* | 10/2004 | Terada et al. | 425/174.4 |
| 2004/0226654 A1* | 11/2004 | Hongo et al. | 156/345.11 |
| 2005/0247673 A1* | 11/2005 | Delamarche et al. | 216/83 |

FOREIGN PATENT DOCUMENTS

| | | | |
|---|---|---|---|
| JP | 07-058000 | * | 3/1995 |
| JP | 07-326602 | * | 12/1995 |
| JP | 08-160434 | * | 6/1996 |
| JP | 10-092784 A | | 4/1998 |
| JP | 11-233481 A | | 8/1999 |
| JP | 2001-068449 | * | 3/2001 |
| JP | 2004-274028 A | | 9/2004 |
| JP | 2005-079219 A | | 3/2005 |
| JP | 2005-515613 T | | 5/2005 |
| JP | 2006-088033 A | | 4/2006 |
| WO | WO-99/16109 A1 | | 4/1999 |
| WO | WO-02/095809 A2 | | 11/2002 |
| WO | WO-2005/006431 A1 | | 1/2005 |

OTHER PUBLICATIONS

"International Application Serial No. PCT/JP2007/000965, International Preliminary Report on Patentability issued Jun. 3, 2009", (w/ English Translation), 11 pgs.

"International Application Serial No. PCT/JP2007/000965, International Search Report mailed Dec. 11, 2007", 4 pgs.

"International Application Serial No. PCT/JP2007/000965, Written Opinion mailed Dec. 11, 2007", (w/ English Translation), 9 pgs.

"Japanese Application Serial No. 2006-324224, Office Action dated Dec. 24, 2010", (w/ Partial English Translation), 4 pgs.

"Japanese Application Serial No. 2006-324224, Office Action mailed Jun. 1, 2010", 2 pgs.

"Taiwanese Application Serial No. 096144159, Office Actin dated May 11, 2012", (w/ Partial English Translation). 8 pgs.

"Korean Application Serial No. 2009-7010801, Office Action mailed Oct. 30, 2013", (w/ English Translation), 8 pgs.

* cited by examiner

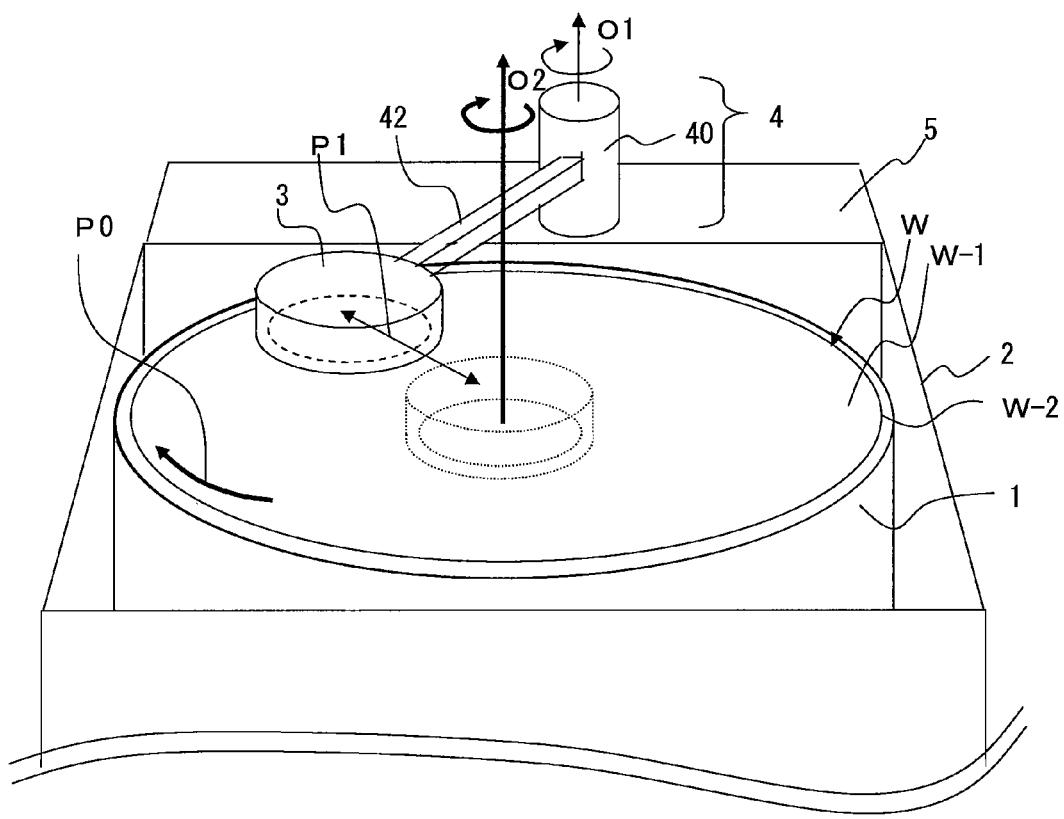
F I G. 1

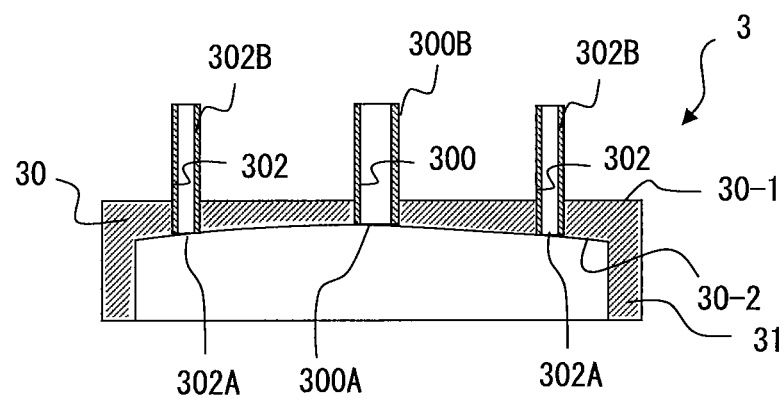
F I G. 2 C

PROCESSING APPARATUS FLUID-PROCESSING A PROCESS TARGET BODY

RELATED APPLICATIONS

This application is a U.S. National Stage Filing under 35 U.S.C. 371 from International Application No. PCT/JP2007/000965, filed on Sep. 6, 2007, and published as WO 2008/068880 A1 on Jun. 12, 2008, which claims the benefit of priority to Japan Application Serial No. 2006-324224, filed on Nov. 30, 2006, which applications and publication are incorporated herein by reference in their entirety.

TECHNICAL FIELD

The present invention relates to a processing apparatus applying a process using a fluid to a process target body by causing a fluid to come into contact with the process target body.

BACKGROUND ART

Conventionally, there have been several methods available for cleaning a substrate such as a semiconductor wafer (simply noted as "wafer" hereinafter). Examples of these methods include a spin cleaning method in which a cleaning fluid is applied to a substrate by rotating the substrate, and a cleaning method in which a substrate itself is immersed in a cleaning fluid.

In the spin cleaning method, a cleaning fluid is dropped approximately at the center of the surface of a substrate, the fluid is spread on the surface by rotating the substrate, and the fluid is shaken off the substrate by the centrifugal force of the rotating substrate and into a recovery box placed outside of the substrate, and thereby the substrate is cleaned.

When dust attached to a substrate is to be cleaned off, pure water is used as the cleaning fluid to wash away the dust via a current of the pure water.

If an adhesive used in the previous process is left on the substrate, a solution such as alcohol is used as the cleaning fluid and the adhesive is removed by dissolving it.

In particular, in a process for thinning a wafer, a contamination generated during the grinding/polishing process of the wafer (simply noted as "contamination" or "contaminant" hereinafter) is cleaned by water cleaning, while an adhesive left after releasing the support plate used for supporting the wafer is removed by a cleaning method using a solution.

In the above described cleaning process using the solution, the ground surface of a wafer has, in most cases, a dicing tape attached to it that is used in a later process. Consequently, in the cleaning process, it is already confirmed that applying a spin method using the solution actually deteriorates the dicing tape.

Meanwhile, there is an example of applying a similar mechanism to the above described spin cleaning method to a development apparatus. That is, in a development apparatus applying a photoresist to a substrate, transferring a circuit pattern to the photoresist by using a photolithography technique, and developing a coated resist film by supplying a latent pattern-formed surface with a developing fluid, a spin method is employed as a mechanism for supplying the photoresist with the developing fluid (refer to reference patent document 1).

In the above described spin cleaning method, the entirety of the supplied cleaning fluid can be applied to the substrate more securely than in a cleaning method in which the substrate itself is immersed in the cleaning fluid because the cleaning fluid is applied to a substrate by rotating the substrate and it is shaken off into a recovery box by the centrifugal force of the rotation.

[Reference patent document 1] Laid-Open Japanese Patent Application Publication No. 2004-274028, paragraphs [0002] and [0003]

DISCLOSURE OF THE INVENTION

A processing apparatus according to a preferred embodiment of the present invention comprises: supply means for supplying a fluid; process target body processing means for processing a process target body by causing a fluid supplied from the supply means to come into contact with a process target body while preventing the fluid from being scattered; recovery means for recovering the fluid supplied to the process target body processing means; and support means for supporting the process target body processing means so as to not allow it to come into contact with the process target body. The processing apparatus is configured as such in order to solve the problem of a large amount of a mist-like fluid attaching to the surface of the process target body and the problem of consuming a large amount of the fluid for a fluid-using process when the processing apparatus applies the fluid-using process to a predetermined region on the process target body.

The configuration suppresses a mist-like cleaning fluid from attaching to the processed body, enabling a fluid-using process with a small amount of the fluid.

BRIEF DESCRIPTION OF THE DRAWINGS

FIG. 1 is a diagram showing the configuration of a cleaning unit according to a first preferred embodiment of the present invention;

FIG. 2C is a cross-sectional diagram of the fluid contact-use jig according to the first embodiment of the present invention;

BEST MODE FOR CARRYING OUT THE INVENTION

Figure 2A:
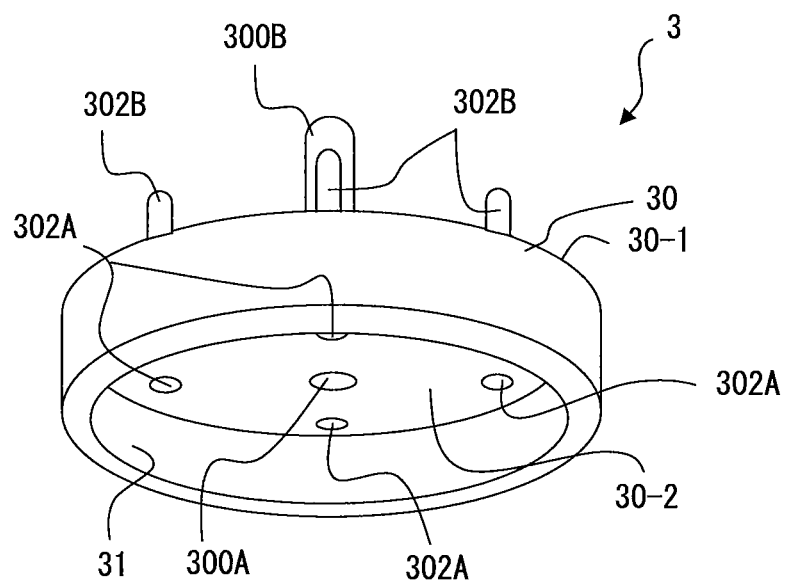
FIG. 2A is a diagonal view diagram of a fluid contact-use jig according to the first embodiment of the present invention.

The following is a description, in detail, of the preferred embodiment of the present invention with reference to the accompanying drawings.

A processing apparatus according to a preferred embodiment of the present invention comprises: supply means for supplying a fluid; process target body processing means for processing a process target body by causing a fluid supplied from the supply means to come into contact with a process target body while preventing the fluid from being scattered; recovery means for recovering the fluid supplied to the process target body processing means; and support means for supporting the process target body processing means so as to not allow it to come into contact with the process target body.

An example configuration is such that the process target body processing means comprises a supply inlet through which the fluid is supplied from the supply means; a recovery outlet through which the fluid is recovered to the recovery means; and a protrusion part used for surrounding the supply inlet and recovery outlet, and for preventing the fluid from scattering.

Note that the size of the processing area of the process target body processing means is preferably smaller than the size of the area of the process target body.

Further, the processing apparatus preferably comprises movement means for moving the process target body processing means.

The movement means is preferably configured to move outwardly, for example, the process target body processing means from the center of the process target body when the process target body is processed.

Further, the processing apparatus may further preferably comprise rotation means for rotating the process target body.

Further, the processing apparatus may further preferably comprise drying means for drying the process target body.

Further, if the drying means is gas ejection means for ejecting an inert gas, it is preferable that the gas ejection means be equipped on the rear side of the process target body processing means relative to the direction of moving the process target body processing means when the process target body is processed.

Further, it is preferable that the fluid recovered in the recovery means be circulated to the supply means.

The processing apparatus according to the embodiment of the present invention is configured to support a process target body processing means so as to not come into contact with a process target body, and thereby only the fluid supplied from the supply means comes into contact with the process target body. Further, when the fluid comes into contact with the process target body, the fluid is suppressed from scattering.

Furthermore, the fluid supplied to the surface of the process target body is recovered by the recovery means and therefore the fluid supplied to a predetermined region is quickly recovered so that the predetermined region can be filled with new fluid.

As described above, it is possible to not only cause a fluid to come into contact with the surface of a process target body but also to recover the fluid supplied to the process target body. It is also possible to process the predetermined region of the surface of the process target body without allowing the fluid to overflow from the predetermined region of the process target body when the fluid is made to come into contact with the surface of the process target body. Therefore, it is possible to eliminate a fluid that is shaken off the process target body or to reduce considerably the amount of fluid that is shaken off the process target body. That is, the fluid is prevented from flowing to the reverse side of the process target body or from becoming mist-like.

Furthermore, only the fluid is made to come into contact with a process target body and therefore it is possible to eliminate the process target body from being damaged by coming into contact with the structure of the process target body processing means.

Furthermore, it is possible to supply the predetermined region on a process target body with the fluid and to recover the fluid from the predetermined region without allowing the fluid to scatter to the outside of the predetermined region on the surface of the process target body, and therefore the fluid is used for the predetermined region on the surface of the process target body without waste, and thereby the consumption of the fluid is reduced.

First Embodiment

In a first preferred embodiment, a release apparatus used for releasing a support plate off a wafer is described.

The support plate is made of glass and adhesively attached to a wafer in order to prevent degradation in the handling property of the wafer caused by thinning the wafer. The support plate is adhesively attached to the wafer, for example with an adhesive, prior to thinning the wafer and then is peeled off (i.e., released from) the wafer after, for example, adhesively attaching a dicing tape to the thinned wafer following the thinning process.

The release apparatus according to the first embodiment comprises: a unit for releasing a support plate from a wafer by melting an adhesive layer adhesively attaching the wafer to the support plate; a unit for cleaning the wafer (noted as "cleaning unit" hereinafter), for example by removing an adhesive remaining on the wafer after releasing the support plate; a unit for drying the wafer after cleaning it; a transport robot used for transporting the wafer between the aforementioned respective units; an alignment adjustment unit used for aligning the wafer, for example in the X-Y direction; and other relevant components.

FIG. 1 is a diagonal view diagram of the cleaning unit among the aforementioned respective units.

As shown in FIG. 1, the cleaning unit comprises: a rotary table 1 for mounting a wafer; a recovery container 2 configured as surrounding the periphery of the rotary table 1; a fluid contact-use jig 3 for causing a fluid to come into contact with the exposure surface W-1 (i.e., the circuit forming surface) of a wafer W mounted on the rotary table 1; and a support unit 4 used for supporting the fluid contact-use jig 3 above the wafer W without allowing it to come into contact with the wafer W.

Incidentally, the assumption is that the fluid contact-use jig 3 is used for a cleaning process to remove an adhesive left on a wafer W after releasing a support plate (not shown in a drawing herein). Accordingly, a fluid caused to come into contact with the exposure surface W-1 of the wafer W uses a cleaning fluid (i.e., according to the present embodiment, a solution, such as alcohol, for melting the adhesive is used).

The rotary table 1 is configured to rotate about the center axis (i.e., the axis O2 shown in FIG. 1) at a predetermined rotation speed under the control of a first motor (not shown in a drawing herein) that is mounted under the rotary table 1.

Further, the rotary table 1 is provided with a large number of holes (not shown in a drawing herein) in the area where the wafer W is mounted, with the holes connected to a vacuum pump (not shown in a drawing herein) so that the wafer W is suctioned onto the rotary table 1 through the holes by means of the vacuum suction of the vacuum pump.

During the cleaning process for removing an adhesive on the wafer, the rotary table 1 rotates the wafer W while suctioning it onto the rotary table 1 by means of the vacuum suction, thereby rotating the wafer W about the axis O2 in the direction indicated by the arrow P0 shown in FIG. 1.

The support unit 4 is structured to support the fluid contact-use jig 3 in a state in which it is kept apart from and above, by a predetermined distance, the upward facing surface W-1 (i.e., the circuit forming surface) of the wafer W that is mounted on the rotary table 1. The present embodiment is configured to equip the support unit 4 so as to form a gap M (with the value m of the gap M being, for example, in the range of $0 < m \leq 3$ mm) between the circuit forming surface W-1 of the wafer W and the fluid contact-use jig 3.

The support unit 4 further comprises a mechanism for moving the fluid contact-use jig 3. The movement mechanism is provided for moving the fluid contact-use jig 3 in the radial direction of the wafer W while maintaining the distance between the fluid contact-use jig 3 and the wafer W mounted on the rotary table 1 at the gap M. Here, the movement mechanism is configured as a rotary actuator constituted by combining the motor, rotation shaft, swing arm, and the like.

FIG. 1 shows, as a part of the support unit 4, a rotation shaft 40 mounted in the vertical direction (i.e., the up/down direction of FIG. 1) and a horizontal bar (the aforementioned swing arm) 42 connecting the rotation shaft 40 and fluid contact-use jig 3 together.

The rotation shaft 40 is configured to rotate about the center axis (i.e., the axis O1 shown in FIG. 1) under the control of a second motor (not shown in a drawing herein) that is equipped inside of the casing 5.

The swing arm 42, one end of which is fixed to the rotation shaft 40, enables the fluid contact-use jig 3 equipped on the other end to move above the wafer W by means of the rotation of the rotation shaft 40. The length of the swing arm 42 is set in such a manner that the movement locus of the fluid contact-use jig 3 by means of the rotation of the rotation shaft 40 follows the line that interconnects the center of the wafer W and the edge W-2 thereof. The present embodiment is configured such that the movement locus tracks on a slightly curved line; it is alternatively possible to make the locus an approximately straight line by elongating the swing arm 42 on an as required basis.

When a cleaning process is begun to remove the adhesive on the wafer W, the rotation of the second motor is controlled and thereby the support unit 4 moves the fluid contact-use jig 3 above the wafer W in the radial direction (i.e., the direction of the arrow P1 shown in FIG. 1), which interconnects the center of the wafer W and the edge W-2 thereof, while maintaining the gap M therefrom.

Here, the fluid contact-use jig 3 is used for causing the solution to come into contact with the exposure surface W-1 (i.e., the circuit forming surface) of the wafer W mounted on the rotary table 1, as already described.

The fluid contact-use jig 3 comprises a supply inlet for supplying the exposure surface W-1 of the wafer W with a solution and a recovery outlet for recovering the solution from the exposure surface W-1.

Specifically, the supply inlet is equipped as a through hole for guiding the solution, which is supplied by a fluid (e.g., solution) supply means (which is described later), onto the wafer W.

Likewise, the recovery outlet is also equipped as a through hole for causing the fluid (e.g., solution) recovery means (which is described later) to recover the solution accumulating on the wafer W.

Figure 2B:
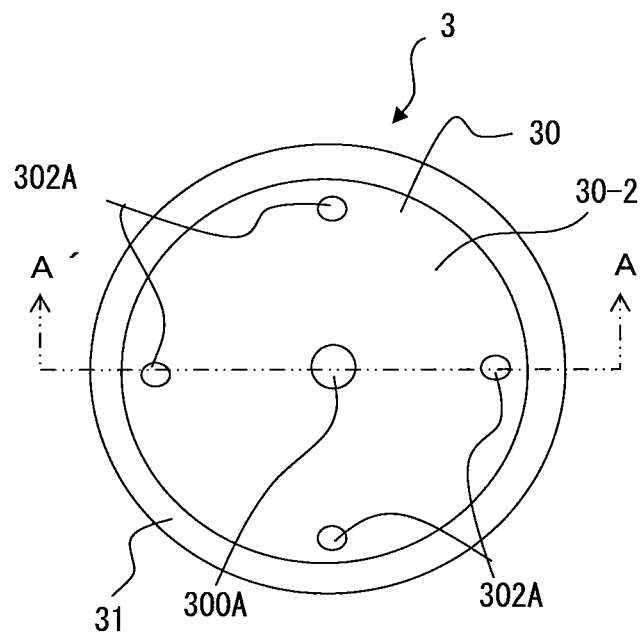
FIG. 2B is a bottom view diagram of the fluid contact-use jig according to the first embodiment of the present invention.

FIGS. 2A through 2C are diagrams showing an exemplary configuration of the fluid contact-use jig 3. FIG. 2A is a diagonal view diagram of the fluid contact-use jig 3; FIG. 2B is a bottom view diagram thereof; and FIG. 2C is a cross-sectional diagram thereof along the line A-A' indicated in FIG. 2B.

As shown in FIGS. 2A through 2C, the fluid contact-use jig 3 is configured to provide a protrusion part 31 along the circumference of the circular bottom plate 30.

The bottom plate 30 is equipped with a plurality of through holes 300 and 302 which penetrate from the bottom surface 30-2 of the bottom plate 30 to the top surface 30-1 thereof.

One through hole 300 is equipped at the center of the bottom plate 30 and is used as the supply inlet by being connected to the fluid (e.g., solution) supply means, while four through holes 302, for example, are equipped near the circumference of the bottom plate 30 and are used as the recovery outlets by being connected to the fluid (e.g., solution) recovery means.

The opening part 300A of the through hole 300 is positioned at the center of the surface 30-2 (which is called "solution accumulating surface" as appropriate hereinafter because the surface 30-2 is on the side on which the solution accumulates, which is described later) on the bottom side of the bottom plate 30, while the opening parts 302A of four through holes 302 are positioned at equal distances in four respective directions from the opening part 300A on the surface 30-2 on the aforementioned bottom side.

In the meantime, a surface 30-1 (i.e., the surface on the upper side as shown in FIG. 2A), which is on the reverse side of the accumulating surface 30-2 of the bottom plate 30, is equipped with connection units 300B and 302B which are formed protrudingly and respectively connect the through hole 300 to the solution supply means and the through hole 302 to the solution recovery means.

The protrusion part 31 is equipped in a wall-like form along the circumference of the bottom plate 30 at a constant height from the circumference thereof on the solution accumulating surface 30-2 side, surrounds the solution remaining surface 30-2, that is, the respective opening parts 300A and 302A of the through holes 300 and 302, and plays the role of preventing the solution, which flows onto the accumulating surface 30-2 from the supply inlet-use opening part 300A of the bottom plate 30, from scattering to the outside of the predetermined area. More specifically, the protrusion part 31 prevents the solution supplied onto the wafer W from flowing out through a gap M (which is described in detain later) between the fluid contact-use jig 3 and wafer W when the solution is supplied onto the wafer W from the supply inlet-use opening part 300A in a state in which the fluid contact-use jig 3 is placed opposite to the wafer W with the gap M maintained between the protrusion part 31 and wafer W. Although the function is described in detail later, it can be briefly noted that the function of the prevention can be attained by setting the size of the gap M so as to not allow the solution to flow out through the gap M on the basis of the surface tension of the solution.

Thusly equipping the gap M between the protrusion part 31 and wafer W makes it possible to cause only the solution to come into contact with the wafer W without allowing the fluid contact-use jig 3 to touch the wafer W.

The solution supply means is configured to guide a fluid reserved in a tank (i.e., a supply-use tank) or the like to the fluid contact-use jig 3. That is, although it is not shown in FIG. 1 or FIGS. 2A through 2C, the solution supply means comprises: a supply-use tank reserving a solution; a send-out pump for pumping out the solution reserved in the supply-use tank; an open-shut valve for adjusting the supply amount of the solution to the fluid contact-use jig 3; and a freely flexible hose for guiding the solution pumped out from the supply-use tank to the supply-use through hole 300 of the fluid contact-use jig 3.

Meanwhile, the solution recovery means is configured to guide the fluid accumulating in the fluid contact-use jig 3 to a tank (i.e., a recovery-use tank). That is, although it is also not shown in a drawing herein, the solution recovery means comprises: a recover-use tank for reserving a recovered solution; a vacuum pump or ejector for putting the inside of the recover-use tank into negative pressure; an open-shut valve for adjusting the recovering amount of the solution from the fluid contact-use jig 3; and a freely flexible hose for guiding the solution recovered from the recovery-use through hole 302 of the fluid contact-use jig 3 to the recovery-use tank.

The individual hoses are each respectively connected to the connection unit 300B of the supply-use through hole 300 or the connection unit 302B of the recovery-use through hole 302 shown in FIGS. 2A through 2C.

Figure 3A:
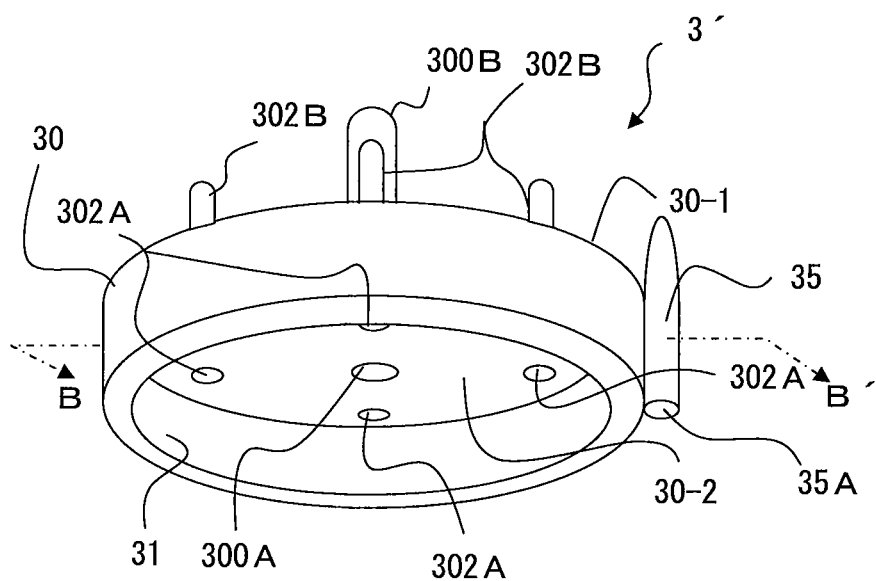
FIG. 3A is a diagonal view diagram of a fluid contact-use jig according to an exemplary modification.
Figure 3B:
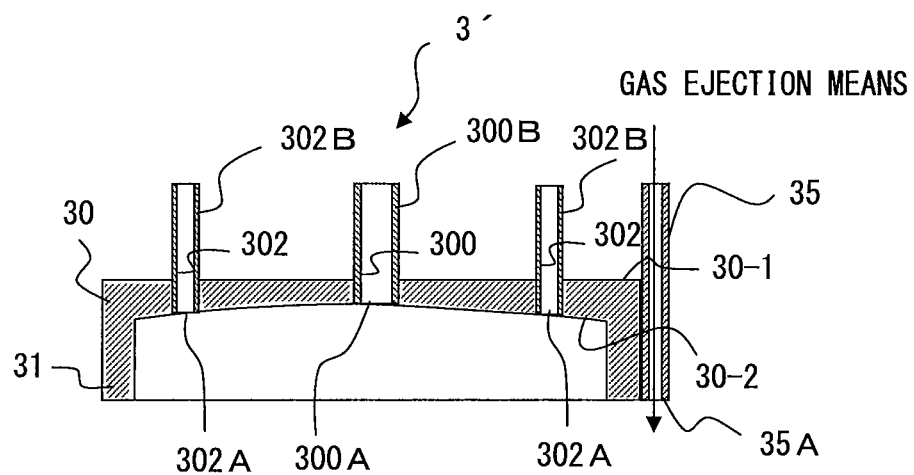
FIG. 3B is a cross-sectional diagram of the fluid contact-use jig according to an exemplary modification.

FIGS. 3A and 3B together show an exemplary modification of the fluid contact-use jig 3, with FIG. 3A being a diagonal view diagram of the fluid contact-use jig 3 according to the exemplary modification, and FIG. 3B being a cross-sectional diagram, along the line B-B' indicated in FIG. 3A, of the fluid contact-use jig 3 according to an exemplary modification.

As shown in FIGS. 3A and 3B, the fluid contact-use jig 3' according to the present exemplary modification is configured to equip the fluid contact-use jig 3, which is shown in FIGS. 2A through 2C, further with, for example, a drying-use nozzle (noted as "drying nozzle" hereinafter) 35 as drying means. The drying nozzle 35 is provided for guiding a gas onto a wafer in order to dry a fluid (i.e., a solution in the present embodiment) on the wafer so that a gas sent from, for example, gas ejection means (which is described later) is blown onto the wafer from the ejection outlet 35A of the drying nozzle 35. The arrow shown in FIG. 3B indicates the ejecting direction of the gas.

The drying nozzle 35 in the fluid contact-use jig 3' is preferably equipped to be to the rear relative to the moving direction of the fluid contact-use jig 3' that moves over the wafer. In particular, the drying nozzle 35 is preferably equipped at a position which follows a wafer region contacting the solution when the fluid contact-use jig 3' moves over the wafer.

The gas ejection means is, for example, the means for ejecting the gas contained in a gas supply-use tank, and, although not shown in a drawing herein, comprises: a gas supply-use tank containing a gas; a send-out pump for ejecting the gas contained in the gas supply-use tank; an open-shut valve for adjusting the ejecting amount of the gas to the fluid contact-use jig 3'; and a freely flexible hose for guiding the gas ejected from the gas supply-use tank to the drying nozzle 35 of the fluid contact-use jig 3'. Note that the kind of the gas to be used is preferably an inert gas such as a nitrogen gas.

Figure 4:
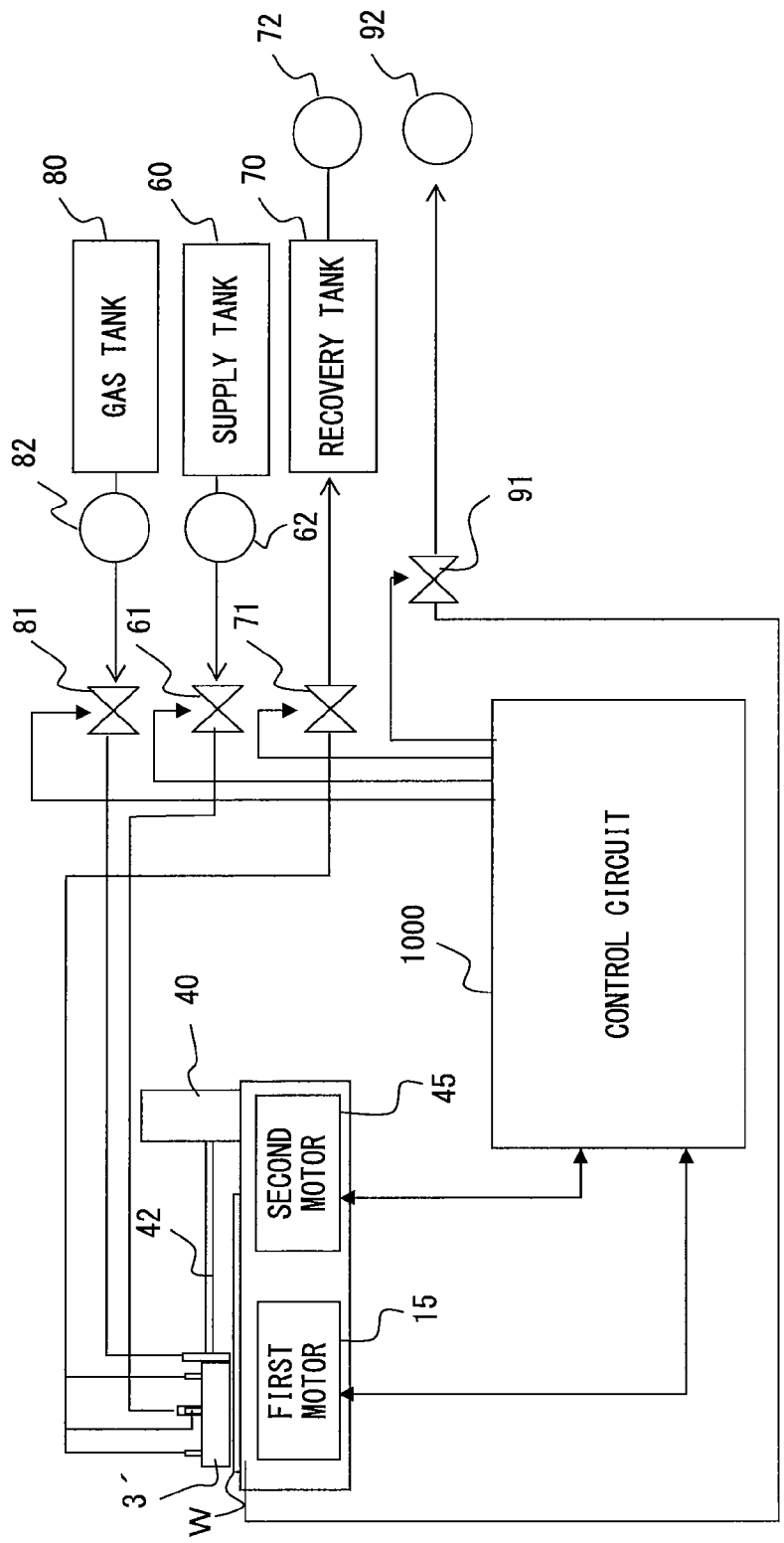
FIG. 4 is a diagram showing the control system of a cleaning apparatus according to a first preferred embodiment of the present invention.

FIG. 4 is a diagram showing the control system of a cleaning apparatus comprising the above described fluid contact-use jig 3' and that of the peripheral equipment.

As shown in FIG. 4, the cleaning unit comprises: a first motor 15 and a second motor 45, both of which are comprised in the cleaning unit; and a control circuit 1000 used for managing the controls of the respective units including an open-shut valve 61 used for a supply-use tank (simply noted as "supply tank" hereinafter) 60 to supply with a solution, an open-shut valve 71 used for a recovery-use tank (simply noted as "recovery tank" hereinafter) 70 to recover the solution, an open-shut valve 81 used for a gas tank 80, an open-shut value 91 used for a vacuum pump 92 that is connected to a rotary table 1, and other relevant components, which are comprised in the peripheral equipment. The control circuit 1000 is constituted by, for example, an arithmetic operation unit, a control unit, and a storage unit, and executes a prescribed program pre-stored in the storage unit, thereby controlling the aforementioned respective units as described later. The control circuit 1000 controls the respective rotations of the first motor 15 and second motor 45, and the opening/closing of the respective valves, that is, the open-shut valve 61 used for a supply tank 60 to supply with a solution, the open-shut valve 71 used for a recovery tank 70 to recover the solution, the open-shut valve 81 used for a gas tank 80, and the open-shut value 91 used for a vacuum pump 92 connected to a rotary table 1.

Further, control circuit 1000 is connected to a central control circuit (not shown in a drawing herein) managing the operations of the above described individual units and transport robot, which constitute the release apparatus, and is engaged in a mutual communication and the like with the aforementioned central control circuit, thereby controlling the respective units of the cleaning unit.

The following are further exemplary controls for the respective units, the control being performed by the control circuit 1000.

That is, the wafer W is placed on the rotary table 1 by the worker, transport robot, or the like, followed by opening the open-shut valve 91 connected to the vacuum pump 92. This operation causes the wafer W to be suctioned onto the rotary table 1 and fixed thereon.

Then, the fluid contact-use jig 3' is moved to an initial position. If it is programmed, for example, that the fluid contact-use jig 3' follows a movement path in the radial direction from the center of the wafer W toward the outer perimeter thereof, the center of wafer W becomes the aforementioned initial position. Accordingly, the fluid contact-use jig 3' is moved to the center of the wafer W by controlling the rotation of the second motor 45 and is stopped at the center of the wafer W. Note that the following descriptions are also provided on the basis of the assumption that the fluid contact-use jig 3' follows the aforementioned movement path.

Then, the respective open-shut valves 61, 71 and 81 of the solution supply tank 60, solution recovery tank 70, and gas tank 80 are opened. This prompts the send-out pump 62 to supply the fluid contact-use jig 3' with the solution from the solution supply tank 60. It also prompts the send-out pump 82 to supply the fluid contact-use jig 3' with the gas from the gas tank 80. Furthermore, the vacuum pump 72 vacuum-suctions the solution that has been supplied to the fluid contact-use jig 3' and that now accumulates thereon and recovers it in the solution recovery tank 70.

Subsequently, the rotary table 1 is rotated by controlling the rotation of the first motor 15. The rotation of the rotary table 1 is preferably maintained at a slow speed so as to prevent the solution that has been supplied from the solution supply tank 60 from scattering outward due to centrifugal force through the gap M between the fluid contact-use jig 3' and the wafer w.

Figure 5A:
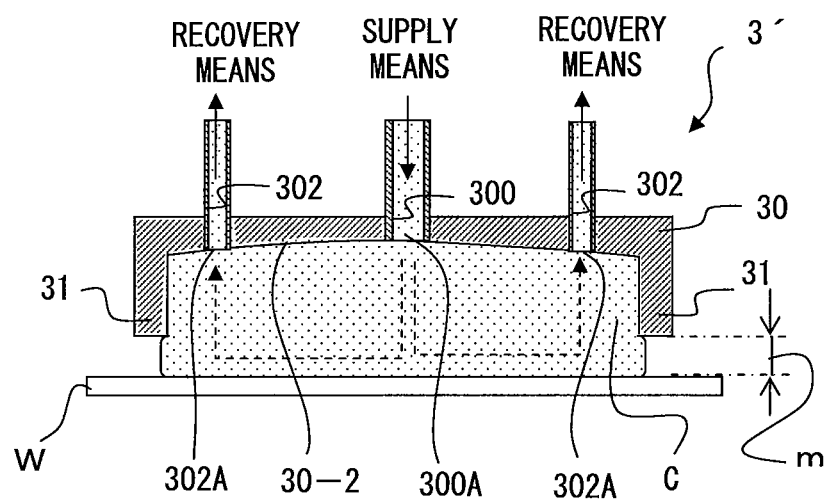
FIG. 5A is a diagram showing the state of a fluid when a fluid contact-use jig is placed proximately to a wafer.
Figure 5B:
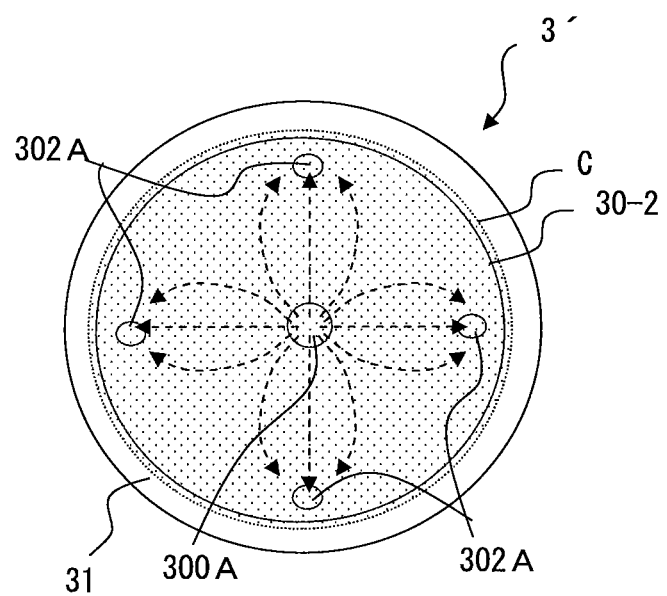
FIG. 5B is a diagram showing the state of a solution viewed from the bottom surface 30-2.

FIGS. 5A and 5B are diagrams together showing the state of a fluid when the fluid contact-use jig 3' is placed proximately to a wafer with a gap M between them, with FIG. 5A showing a cross-sectional diagram of the fluid contact-use jig 3' (shown in FIG. 3B) overlapped with the state of the solution (with the dry-use nozzle removed), and FIG. 5B showing a view of the state of the solution in the fluid contact-use jig 3' viewed from the bottom surface 30-2. Note that the paths of the solution flowing are indicated by arrows in these figures.

Further, FIG. 5A also shows the wafer W in order to indicate the positional relationship among the fluid contact-use jig 3', the solution, and the wafer W.

As indicated by the solid line arrow in FIG. 5A, the solution is supplied to the accumulating surface 30-2 through the supply inlet 300, and accumulates in the space (i.e., a solution holding part C that is described later) sandwiched between the fluid contact-use jig 3' and the wafer W.

The fluid contact-use jig 3' does not come into contact with the wafer W as already noted, so that the inside space of the fluid contact-use jig 3' and the outside space thereof are interconnected through a very small gap M between the protrusion part 31 of the fluid contact-use jig 3' and the wafer W. The size m of the gap M is set at a value (e.g., 0 mm≤m≤3 mm) so as to not allow the solution by its surface tension to scatter to the outside of the fluid contact-use jig 3' through the gap M when the solution is supplied to the inside space of the fluid contact-use jig 3'.

By virtue of the gap M, the solution remains in the aforementioned space, that is, in the solution holding part C shown in FIGS. 5A and 5B, instead of scattering to the outside space of the fluid contact-use jig 3'. The solution accumulating in the solution holding part C comes into contact with the wafer W and applies a fluid processing thereto. That is, the present example applies a dissolving process to the adhesive remaining in the region of the wafer W corresponding to the solution holding part C.

Likewise, as indicated by the solid line arrow in FIG. 5A, the solution in the solution holding part C is suctioned through the through hole 302 to be recovered to the recovery tank 70. Therefore, the flows of fluid (i.e., the convection) as indicated by dotted line arrows shown in FIGS. 5A and 5B are generated within the solution holding part C and thereby the fluid processing on the wafer W is facilitated. Further, the used solution within the solution holding part C is quickly replaced with a new solution by recovering the solution accumulating in the solution holding part C.

Incidentally, the configuration is such that the pressure of the solution supplied from the supply tank is appropriately adjusted in order to prevent the solution from scattering to the outside through the above described gap M.

Returning to FIG. 4 to continue the description thereof, following the above described control for rotating the rotary table 1, the fluid contact-use jig 3' is moved in the radial direction of the wafer W by controlling the second motor 45 while rotating the rotary table 1. The movement is carried out in a procedure, for example, of sequentially moving the fluid contact-use jig 3' against the wafer W in the radial direction by a predetermined width per a predetermined amount of time.

Note that the movement in the radial direction may be finished with a movement in only one direction or by repeating reciprocal movement. The movement of the fluid contact-use jig shall be such that the solution evenly covers the adhesive remaining on the wafer W.

Further, if the fluid contact-use jig 3' overruns the edge of the wafer W a large amount, the solution flows over to the recovery container 2 from the part where the overrun occurred, failing to recover the solution for the overrun amount into the recovery tank 70. Therefore, the control is such as to keep the overrun part of the fluid contact-use jig 3' from the edge of the wafer W within a range in which the surface tension for preventing the scattering of the solution is maintained while the fluid contact-use jig 3' is supplied with the solution.

A remainder of the fluid containing a dissolved adhesive is attached to the movement track of the fluid contact-use jig 3'. The present example is equipped with a drying-use nozzle (simply noted as "drying nozzle" hereinafter) 35 so that a gas is ejected from the drying nozzle 35 toward the wafer W during the above described fluid processing, and thereby the remaining fluid can be dried at the point immediately after the movement of the fluid contact-use jig 3'. That is, it is possible to evaporate the remainder of the adhesive melted fluid.

Upon finishing the above process, the respective open-shut valves 61, 71 and 81 of the solution supply tank 60, solution recovery tank 70, and gas tank 80 are closed. In this event, the timing of closing the individual open-shut valves 61, 71 and 81 and the timing of the fluid contact-use jig 3' retracting to the outside of the wafer W may be appropriately set. For example, the timings of closing the valves may be delayed for predetermined periods of time, in order of the open-shut valve 61 of the solution supply tank, the open-shut valve 71 of the solution recovery tank, and the open-shut valve 81 of the gas supply. Such a control makes it possible to recover the solution accumulating in the fluid contact-use jig 3' quickly during the delay time to the recovery tank 70. Further, if a configuration is such as to retract the fluid contact-use jig 3' from above the wafer W before the gas supply-use open-shut valve 81 is closed, the remaining fluid in the region where the solution is made to come into contact with the wafer W last can be dried, instead of leaving the fluid as is.

Then, lastly, the fluid contact-use jig 3' is retracted to a predetermined removal position where the wafer W can be removed, the drive of the first motor 15 is stopped so as to stop rotating the rotary table 1, and the vacuum suction-use open-shut value 91 is closed to enable the worker, transport robot, or the like to remove the wafer W from the rotary table 1.

Note that the above description is provided by exemplifying the case of drying the remaining fluid at the spot immediately after the solution is made to come into contact with the wafer W; another procedure of drying may alternatively be adopted. For instance, a procedure in which a gas supply is stopped during a cycle of processing the entirety of a wafer with the solution, and, upon completing the aforementioned processing, a fluid contact-use jig is moved over the wafer W, while the gas is kept supplied, along the path over the wafer as the path over which the fluid contact-use jig moved during the aforementioned cycle, and thereby the wafer W is dried.

Alternatively, it is possible to configure such that the fluid contact-use jig has no drying nozzle and a drying means may be equipped separately from the fluid contact-use jig as shown in FIGS. 2A through 2C. For instance, another movement mechanism which equips a drying nozzle may be provided separately from the above described movement mechanism and the drying nozzle may be moved over the wafer by the same procedure as that of the movement mechanism of the fluid contact-use jig, thereby making it possible to blow the wafer with a gas.

The release apparatus according to the first embodiment is configured to be equipped with a fluid contact-use jig having a diameter smaller than that of a wafer. Therefore, the use of a fluid contact-use jig with, for example, a 6-inch diameter or smaller enables a fluid processing for a wafer with a 6-inch diameter or larger. Accordingly, merely changing (i.e., increasing or decreasing) the width of swinging the fluid contact-use jig in the radial direction of the wafer (as an example) makes it possible to adapt to cleaning a wafer having a diameter of 6 inches or larger, for example 8 inches or 12 inches. In other words, one provision of such a fluid contact-use jig with a small diameter makes it possible to be compatible with wafers of any diameter.

Second Embodiment

In a second preferred embodiment, a development apparatus utilized when a circuit is formed on a wafer is described.

A circuit forming on a wafer is carried out through a lithography process or other such process. That is, in the case of applying lithography, the process consists of applying a resist on a wafer surface, exposure, and development, in this order. Among the processes, the exposure process is for transferring a circuit pattern onto the resist applied onto the wafer surface, while the development process is for performing the process of applying a developing solution onto the resist so as to dissolve the resist on locations other than on the circuit pattern. Upon completing the aforementioned lithography process, a circuit pattern is formed on the wafer by applying an etching process and then the remaining resist is removed.

Figure 6:
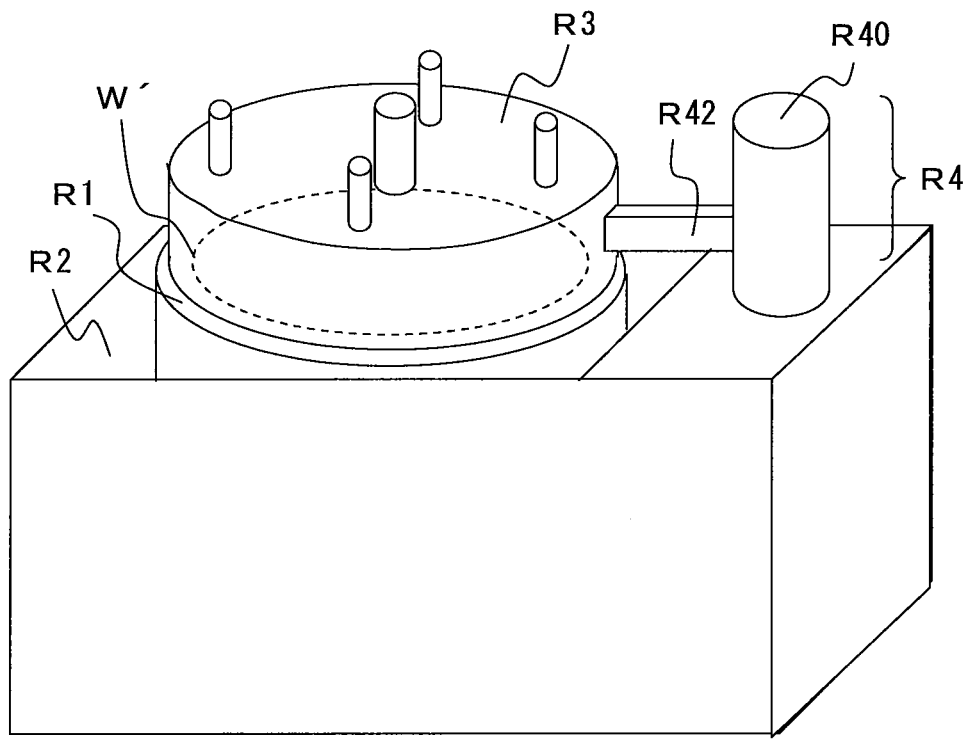
FIG. 6 is a diagram showing the configuration of a development apparatus according to a second preferred embodiment of the present invention.

FIG. 6 is a diagonal view diagram of a development apparatus, comprising a fluid contact-use jig, according to a second preferred embodiment.

The development apparatus shown in FIG. 6 comprises: a table R1 for mounting a wafer; a recovery container R2 configured to surround the circumference of the table R1; a fluid contact-use jig R3 for causing the fluid to come into contact with the exposure surface (i.e., the surface coated with a resist) of a wafer W' mounted on the table R1 (N.B., the wafer W' is shown by dotted lines since it is invisible because it is behind the fluid contact-use jig R3); and a support unit R4 for supporting the fluid contact-use jig R3 above and not coming into contact with the wafer mounted on the table R1.

The table R1 is a conventional table and fixes the wafer W'. The wafer W' is fixed by adopting, for example, the already described suction method.

The fluid contact-use jig R3 according to the present embodiment is described as a tooling used for the application process of a developing fluid for developing a resist after the exposure process. Therefore, in the following description, the fluid which is made to come into contact with the exposure surface (i.e., the resist-coated surface) of the wafer W' is a developing fluid.

The fluid contact-use jig R3 has a structure similar to that of the fluid contact-use jig 3 shown in FIGS. 2A through 2C. An exception is that the fluid contact-use jig R3 according to the present embodiment has an outer diameter approximately the same as, or a little smaller than, the diameter of the above described wafer W'.

Further, the fluid contact-use jig R3 is configured to supply the top of the resist of the wafer W' with a developing fluid through a supply inlet (corresponding to the supply inlet 300 shown in FIGS. 2A through 2C) that is equipped in the fluid contact-use jig R3, and to recover the supplied developing fluid from the top of the resist through a recovery outlet (corresponding to the recovery outlet 302 shown in FIGS. 2A through 2C) that is equipped in the fluid contact-use jig R3.

The support unit R4 is configured to support the fluid contact-use jig R3 in a state in which the fluid contact-use jig R3 is held, by a predetermined distance, above the upward-facing surface (i.e., the resist-coated surface) of the wafer W' that is mounted on the table R1, so that, for example, a gap M (with the value m of the gap M being set, for example, at 0<m≤3 mm) is formed between the resist-coated surface of the wafer W' and the fluid contact-use jig R3.

The support unit R4 according to the present embodiment comprises a movement mechanism for causing the fluid contact-use jig R3 to ascend and descend. The movement mechanism is configured to enable the fluid contact-use jig R3 to ascend or descend between the position at which there is a gap M between the fluid contact-use jig R3 and the upward-facing surface of the wafer W' and the position at which there is a distance enabling the wafer W' to be removed. The movement mechanism accordingly comprises an elevator apparatus capable of positioning the movement mechanism by means of a combination of mechanisms including a servo motor, a ball screw, a slider, and other relevant components.

FIG. 6 shows a part of the support unit R4, that is, a cylindrical cover R40 for accommodating and protecting the aforementioned elevator apparatus (not shown in a drawing herein) and a horizontal bar R42 for connecting together the elevator apparatus and fluid contact-use jig R3. The elevator apparatus adjusts the height of the horizontal bar R42 (that is, the height of the fluid contact-use jig R3 from the wafer W') by controlling the rotation of the servo motor (not shown in a drawing herein).

The support unit R4 sets the position of the fluid contact-use jig R3 at such a height that there is a gap M between the fluid contact-use jig R3 and the upward facing surface of the wafer W' (i.e., the resist-coated surface) and maintains the aforementioned state during the development process.

Figure 7:
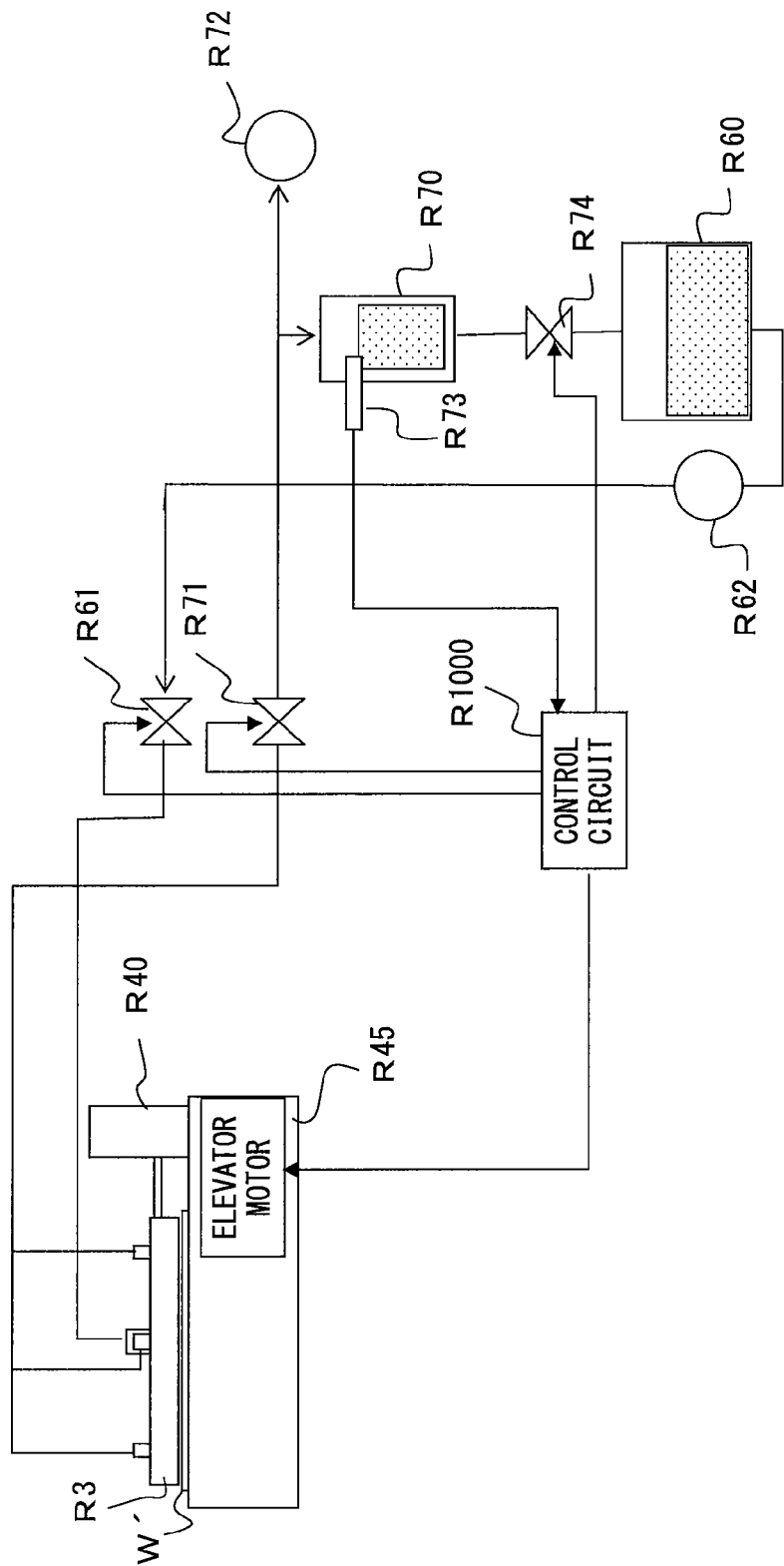
FIG. 7 is a diagram showing the control system of the development apparatus according to the second embodiment of the present invention.

The development apparatus according to the present embodiment is configured such that the recovered developing fluid is returned to the developing fluid supply means, i.e., it is used cyclically. The following is a description of the method for controlling the individual units along with a scheme for recycling the developing fluid with reference to FIG. 7, that is, the control system diagram of the development apparatus and peripheral equipment.

The development apparatus comprises a control circuit R1000 for managing the control of the individual units comprised in the development apparatus. The control circuit R1000 comprises, for example, an arithmetic operation unit, a control unit, a storage unit and other relevant components, and controls the individual units comprised in the development apparatus as exemplified in the following by executing a prescribed program stored in the storage unit. That is, the control circuit R1000 controls the rotation of an elevator motor (i.e., the servomotor) R45, the opening and closing of the open-shut valve 61 of a developing fluid supply tank R60, and that of the open-shut valve 71 of a developing fluid recovery tank R70.

Further, the control circuit R1000 also controls the opening and closing of an open-shut valve R74 for circulating the recovered fluid from the recovery tank R70 to the supply tank R60 in accordance with a signal output from a fluid level sensor R73 equipped in the recovery tank R70.

Further, the control circuit R1000 is connected to, for example, an exposure apparatus (not shown in a drawing herein) and a central control circuit (not shown in a drawing herein) used for managing the operation of a transport robot (not shown in a drawing herein) and controls the individual units comprised in the present development apparatus by engaging in mutual communications, and relevant activities, with the central control circuit.

The following are further exemplary controls for the respective units carried out by the control circuit R1000. That is, when the wafer W' is set on the table R1 with the resist-coated surface of the wafer W' facing upward by the worker, transport robot, or the like, first, the rotation of the elevator motor 45 is controlled so as to cause the fluid contact-use jig R3 to descend to the position at which a gap M is created between the resist on the wafer W' and the protrusion part (corresponding to the protrusion part 31 shown in FIGS. 2A through 2C) of the fluid contact-use jig R3.

Then, the respective open-shut valves R61 and R71 of the supply tank R60 and recovery tank R70 are opened. This operation prompts the fluid contact-use jig R3 to be supplied with the developing fluid from the supply tank R60 by means of the send-out pump R62. Further, the developing fluid once supplied to the fluid contact-use jig R3 and accumulating therein is vacuum-suctioned by the vacuum pump R72 so as to be recovered in the recovery tank R70. The developing fluid recovered in the recovery tank R70 is detected by the fluid level sensor R73 when the fluid level exceeds a predefined height.

Having received a detection signal from the fluid level sensor R73 detecting that the aforementioned fluid level has exceeded the predefined height, the control circuit R1000 opens the circulation-use open-shut valve R74. This operation causes the developing fluid that has been recovered in the recovery tank R70 to be returned to the supply tank R60 so that the developing fluid is reused.

Note that the amount of the developing fluid returned to the supply tank R60, that is, the period of time in which the circulation-use open-shut valve R74 is opened, may be appropriately determined. For example, the period of time required for a portion or the entirety of the developing fluid returned to the recovery tank R70 to flow into the supply tank R60 is measured in advance, and then the time is set in the control circuit R1000 so as to close the circulation-use open-shut valve R74 when the aforementioned period of time has elapsed.

An alternative setup is one in which the fluid level of the developing fluid in the recovery tank R70 falling below a predetermined fluid level is detected by using another fluid level sensor and the control circuit R1000 closes the circulation-use open-shut valve R74 when the detection signal is received.

Subsequently, the respective open-shut valves R61 and R71 of the supply tank R60 and recovery tank R70 are closed when a predetermined time period in which the resist is removed with the developing fluid elapses after the open-shut valve R61 of the supply tank R60 was opened.

Note that the open-shut valve 71 of the recovery tank R70 is preferably closed after closing the open-shut valve R61 of the supply tank R60 in a predetermined delay time so as to be able to recover the entirety of the developing fluid accumulated in the fluid contact-use jig R3.

Then, lastly, the elevator motor R45 is controlled so as to cause the fluid contact-use jig R3 to ascend so as to enable the worker, transport robot, or other means to remove the wafer W'.

The above described control removes the resist other than that of the circuit pattern on the wafer.

The above described first embodiment and second embodiment exemplify the release apparatus and development apparatus as processing apparatuses handling a wafer as the process target body. That is, the release apparatus according to the first embodiment is configured to use a fluid contact-use jig having a diameter smaller than that of a wafer and to cause a solution to partially come into contact with the wafer while moving the fluid contact-use jig. Meanwhile, the development apparatus according to the second embodiment is configured to use a fluid contact-use jig having a diameter approximately the same as that of a wafer so as to wet the entirety of the wafer with a developing fluid at one time.

In either apparatus, however, the diameter of the fluid contact-use jig may be appropriately set, and, for example, the fluid contact-use jig of the cleaning unit may be sized as the fluid contact-use jig used for the development apparatus, or alternatively, the fluid contact-use jig of the development apparatus may be sized as the fluid contact-use jig used for the cleaning unit and be combined with the movement mechanism.

Further, the structure of the fluid contact-use jig shown in each embodiment as an example of the process target body processing means is not limited to the structures shown in FIGS. 2A through 2C or FIGS. 3A through 3B, and instead, the structure may be appropriately modified provided that such a structure is accompanied by the scientific and technical thought of the present invention.

For example, the number, layout, form, or the like of the supply inlet and recovery outlet may be changed. The outer diameter of the fluid contact-use jig and the form of the protrusion part may be changed. Alternatively, the structure of the supply inlet may be changed so as to supply a fluid from the supply inlet in a spray form.

Further, the movement means shown in each embodiment is also an example. Therefore, the movement means may be in another aspect, provided that it is the movement means capable of causing a fluid to come into contact at an arbitrary position on a wafer by using a fluid contact-use jig. For example, a configuration may be such that the wafer is held stationary instead of rotating it and the fluid contact-use jig can be horizontally moved to an arbitrary position above the wafer. Further, in contrast to the aforementioned configuration, an alternative configuration may be such that the position of a fluid contact-use jig is fixed and a wafer can be horizontally moved relative to the fluid contact-use jig.

Meanwhile, the first embodiment is described by exemplifying a vacuum suction system as a table for fixing a wafer; such a system is arbitrary and other means may be employed instead, provided that such means are capable of fixing the wafer.

Further, in the release apparatus according to the first embodiment, the supply means and recovery means are configured to supply the fluid contact-use jig constantly with new fluid; they may be alternatively configured to circulate the fluid recovered by the recovery means to the supply tank by adopting the configuration of the development apparatus according to the second embodiment.

In contrast, the development apparatus according to the second embodiment may adopt the configuration of the release apparatus according to the first embodiment, thereby supplying the fluid contact-use jig constantly with new fluid.

Further, the respective configurations may be combined. In such a case, a possible combination includes a configuration in which the fluid is recycled in the beginning of the process and then new fluid is supplied for a finishing cleaning.

Furthermore, a configuration may comprise a discard-use recovery tank and a reuse-use recovery tank, with a valve for designating a recovery destination for the recovered solution being equipped. The reuse-use recovery tank is provided for recovering a less contaminated solution. Then, the reuse-use recovery tank is preferably connected to a supply-use through hole of the fluid contact-use jig with a freely flexible hose or the like, equips a send-out pump used for sending the solution to the fluid contact-use jig and a open-shut valve used for adjusting the supply amount of the solution, and supplies the fluid contact-use jig with the solution. It is also preferably equipped with a valve, or the like, so as to change over between the aforementioned reuse-use recovery tank and supply tank, either of which supplies the fluid contact-use jig with the solution.

The above described configuration makes it possible to reuse the solution recovered in the reuse-use recovery tank, thereby enabling a reduction in the volume of the solution to be used. Furthermore, the process is, for example, such that the fluid contact-use jig is supplied with a less contaminated solution from the reuse-use recovery tank to clean a wafer and then the supply tanks are changed over by a valve so as to supply the fluid contact-use jig with an unused new fluid to clean the wafer once again. Thusly the wafer is cleaned in two or more steps, and thereby it is possible to further improve the quality of the cleaning process. In particular, it is desirable to use new fluid for the final cleaning.

Note that the above described embodiment is configured to adjust the amount of fluid sent out to a fluid contact-use jig by using the open-shut valve; such a configuration is arbitrary and the amount of fluid may be adjusted by controlling the pump instead.

Further, as described in the first embodiment in which the releasing unit was explained by separating it into individual units, the present invention may be implemented by each single unit. For example, the cleaning unit may be distributed onto the market as a single unit constituting a release apparatus. Further, the cleaning unit may be distributed onto the market in arbitrary combinations with another unit or other units.

Further, the release apparatus and development apparatus are merely shown as examples. In other words, the processing apparatus according to the present invention may be put forth in other embodiments provided that they have the scientific and technical thought of the present invention as illustrated by the above described fluid contact-use jig, that is, they have the scientific and technical thought wherein only a process fluid is caused to come into contact with the wafer and also recovers the post-processing fluid while preventing the fluid from scattering outside.

A processing target exemplified in the present invention is not limited to the above described wafer and a medium such as a compact disk (CD), a digital versatile disk (DVD), or the like may be used instead. For processing these media, a processing apparatus according to the present invention is configured as an apparatus for cleaning the surface using a cleaning fluid such as pure water as the fluid for processing.

As described above, the processing apparatuses shown in the respective preferred embodiments are configured to hold a fluid contact-use jig without coming into contact with the processing target body such as a wafer. Therefore, only the fluid supplied from the supply means is allowed to come into contact with the processing target body. Furthermore, the fluid contact-use jig also plays the role of preventing the fluid supplied by the supply means from scattering. Therefore, the fluid comes in contact with the surface of the processing target body within a predetermined region (i.e., a region on the surface of the wafer corresponding to the solution holding part of the fluid contact-use jig). Furthermore, the fluid supplied to the surface of the processing target body is recovered to the recovery means. Therefore, the fluid supplied to the predetermined region is quickly recovered and the region is filled with new fluid.

That is, the processing apparatuses shown in the respective preferred embodiments can cause the surface of the processing target body to come into contact with the fluid and can recover the fluid supplied onto the present processing target body. Further, the processing apparatuses can process a predetermined region on the surface of the processing target body with the fluid without allowing the fluid to scatter to the outside of the surface of the processing target body when the fluid is made to come into contact with the surface thereof.

As a result, it is possible to prevent a fluid from being shaken off a processing target body to a recovery container in, for example, a processing apparatus employing a spinning method. Even if there is a fluid shaken off to the recovery container, the fluid can be limited to a small amount. As such, an absence of a fluid shaken off to the recovery container, or the presence of very small amount, makes it possible to prevent the fluid from becoming a mist by otherwise colliding with the recovery container.

Further, it is also possible to prevent the fluid from flowing around the surface in contact with the fluid to the back side.

Furthermore, only the fluid is made to come into contact with the processing target body, and therefore it is possible to prevent the processing target body from being damaged by the fluid contact-use jig in contact with the wafer.

Furthermore, the fluid supplied to the predetermined region on the surface of the processing target body can be recovered therefrom without allowing the fluid to scatter outside of the predetermined region, and therefore the fluid is used, without waste, for a fluid processing of the predetermined region on the surface of the processing target body, and thereby the consumption of the fluid is more suppressed than in the conventional technique.

Further, comprising a fluid circulation apparatus, the recovered fluid can be reused and thereby it is possible to obtain an increased effect of saving the fluid.

The invention claimed is:

1. A processing apparatus for cleaning a process target body, comprising:
   a supply tank for supplying a fluid;
   a fluid contact-use jig coupled to the supply tank, the fluid contact-use jig for processing the process target body by causing the fluid supplied from the supply tank to come into contact with a surface of the process target body while preventing the fluid from being scattered,
   wherein the fluid contact-use jig comprises a circular bottom plate having a top surface and a bottom surface and including a plurality of through holes that penetrate from the top surface of the circular bottom plate and through the bottom surface of the circular bottom plate, the fluid contact-use jig further comprising a protrusion part including a wall formed along a circumference of the circular bottom plate, the wall surrounding the circular bottom plate and extending below the bottom surface of the circular bottom plate to form a solution holding part with the bottom surface of the circular bottom plate,
   wherein one of the plurality of through holes is located at the center of the bottom plate and is coupled to the supply tank, operable to supply the fluid from the supply tank to the solution holing part,
   and wherein four of the plurality of through holes are each located near the circumference of the bottom plate at an equal distance in four respectively generally orthogonal directions from the through hole located at the center of the bottom plate;
   a recovery tank coupled to the fluid contact-use jig through each of the four of the plurality of through holes, the recovery tank for recovering the fluid supplied to the solution holding area; and
   a support unit coupled to the fluid contact-use jig, the support unit operable to moveably support the fluid contact-use jig such that the fluid contact-use jig is not in contact with the surface of the target process body while positioning the solution holding part above a predetermined area of the target process body and while having the protrusion part form a gap between the protruding part and the surface of the target processing body,
   wherein the support unit comprises a horizontal bar coupling the fluid contact-use jig with a rotational shaft, the rotational shaft mounted in a vertical direction and operable to rotate in order to move the fluid contact-use jig in a radial direction relative of the surface of the target process body while maintaining a distance between the contact fluid-use jig and the surface of the target process body to be substantially the same as the gap, the horizontal bar having a length set so that the movement locus of the fluid contact jig by mean of the rotation of the rotation shaft follows a line that interconnect a center of the target process body and an outside edge of the target process body, wherein the support unit operable so that when the process target body is being cleaned, the distance of the gap between the protrusion part and the surface of the process target body is set in such a manner that the surface tension of the solution allows the solution to accumulate in an inner space, wherein the inner space is a space between the surface of the process target body and the solution holding part formed by the circular bottom plate and the wall of the protrusion part, and wherein the recovery tank comprising a fluid level sensor operable to detect a fluid level of fluid recovered in the recovery tank, and the processing apparatus further comprising a control circuit to control so as to open an open-shut valve for circulating the fluid from the recovery tank to the supply tank when the fluid level of the fluid detected by the fluid level sensor exceeds a predefined height.

2. The processing apparatus according to claim 1, wherein the fluid contact-use jig further comprises:
- a supply inlet coupled to the one of the plurality of through holes located at the center of the base plate; and
- a plurality of recovery outlets, each of the plurality of recovery outlets coupled to one of the four of the plurality of through holes that are located near the circumference of the base plate, wherein the supply inlet and each of the recovery outlets protrude from the top surface of the circular bottom plate.

3. The processing apparatus according to claim 1, wherein an area of the inside surface of the fluid contact-use jig is an area that is smaller than an area of the surface of the process target body.

4. The processing apparatus according to claim 1, wherein the support unit moves the fluid contact-use jig outwardly from a center of the process target body while processing the process target body.

5. The processing apparatus according to claim 1, further comprising a rotary table for rotating the process target body while processing the process target body.

6. The processing apparatus according to claim 1, further comprising a drying nozzle coupled to the fluid contact-use jig for drying the process target body.

7. The processing apparatus according to claim 6, wherein the drying nozzle is configured for ejecting an inert gas.

8. The processing apparatus according to claim 7, wherein the drying nozzle is equipped on a rear side of the fluid contact-use jig relative to a direction of movement of the fluid contact-use jig while processing the process target body.

9. The processing apparatus according to claim 1, wherein the fluid recovered in the recovery tank is circulated to the supply tank.

10. The processing apparatus according to claim 1, wherein the gap has the distance between the protrusion part and the surface of the process target body in a range of less than 3 millimeters.

* * * * *

UNITED STATES PATENT AND TRADEMARK OFFICE
CERTIFICATE OF CORRECTION

PATENT NO. : 8,720,456 B2
APPLICATION NO. : 12/515891
DATED : May 13, 2014
INVENTOR(S) : Atsushi Miyanari It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 512 days.

Signed and Sealed this

Twenty-ninth Day of September, 2015

Michelle K. Lee
*Director of the United States Patent and Trademark Office*